United States Patent [19]

Heatherington

[11] Patent Number: 4,633,183
[45] Date of Patent: Dec. 30, 1986

[54] CONSTANT RESOLUTION FREQUENCY SYNTHESIZER

[75] Inventor: Dale A. Heatherington, Alpharetta, Ga.

[73] Assignee: Hayes Microcomputer Products, Inc., Norcross, Ga.

[21] Appl. No.: 706,663

[22] Filed: Feb. 28, 1985

[51] Int. Cl.$^4$ ............................................. H03L 7/18
[52] U.S. Cl. ..................................... 328/14; 307/529; 377/44; 377/51; 377/52; 331/1 A
[58] Field of Search .................... 328/14; 377/44, 107, 377/51, 52; 307/529; 331/1 A

[56] References Cited

U.S. PATENT DOCUMENTS

| | | | |
|---|---|---|---|
| 3,935,538 | 1/1976 | Kizler | 307/529 |
| 3,999,049 | 12/1976 | Roche et al. | 328/14 |
| 4,007,459 | 2/1977 | Hagelbarger | 328/14 |
| 4,110,567 | 8/1978 | Boucher | 328/14 |
| 4,504,799 | 3/1985 | Elmis et al. | 331/1 A |
| 4,504,800 | 3/1985 | Plouviez | 331/1 A |
| 4,518,920 | 5/1985 | Warner et al. | 328/14 |
| 4,519,091 | 5/1985 | Chu et al. | 377/44 |
| 4,546,487 | 10/1985 | Dackow | 377/51 |

Primary Examiner—John S. Heyman
Attorney, Agent, or Firm—Jones & Askew

[57] ABSTRACT

A frequency synthesizer which has a constant resolution over an octave frequency range is disclosed. The frequency synthesizer has a presettable high speed counter, a low speed counter, an adjusting counter, and a count selector. The low speed counter provides a first output signal whose frequency is rapidly alternated between two closely-spaced frequencies so that the average frequency of the output signal is the desired frequency. The adjusting counter determines the period of time that each of the closely-spaced frequencies is present at the output. The count selector determines the frequency of each of the two closely-spaced frequencies. The frequency synthesizer also has a phase splitter and provides a second output signal which is also of the desired frequency but which is phase-shifted by ninety degrees from the first output signal.

8 Claims, 4 Drawing Figures

CONSTANT RESOLUTION FREQUENCY SYNTHESIZER

TECHNICAL FIELD

The present invention relates to digital frequency synthesizer circuits, and specifically is an improved digital frequency synthesizer with substantially constant frequency resolution over a relatively wide range of output frequencies.

BACKGROUND OF THE INVENTION

Frequency synthesizer circuits generally operate by using an oscillator which generates a high frequency clock signal and feeding the high frequency clock signal into a series of cascaded, programmable "divide-by-n" counter stages to generate a signal at a desired precise frequency. The counter stages are programmed by presetting the counter stages with a digital word which represents a value, N (or in some systems, the complement of N) then incrementing, or decrementing, as the case may be, the counter stages until either an overflow condition or an "all zero" condition is reached. The counter is then preset to N (or its complement) and the cycle is repeated. The value of N is typically determined by the equation:

$$N = \frac{f_{mc}}{f_{des}} \quad (1)$$

where N is the divide ratio, $f_{mc}$ is the clock frequency, and $f_{des}$ is the desired output frequency. Equation (1) can be easily rearranged to yield:

$$f_{des} = \frac{f_{mc}}{N} \quad (2)$$

The frequency resolution, $\Delta f$, of such a system, which is the difference between the output frequency for $N=N_1$, and the output frequency for $N=N_1+1$, is:

$$\Delta f = f_{(N1)} - f_{(N1+1)} = \frac{f_{mc}}{(N_1)} - \frac{f_{mc}}{(N_1 + 1)} = \frac{f_{mc}}{N_1(N_1 + 1)} \quad (3)$$

Substituting the N of equation (1) for the $N_1$ of equation (3) yields:

$$\Delta f = \frac{f_{des}^2}{f_{mc} + f_{des}} \quad (4)$$

Rearranging equation (4) shows that $$f_{mc} = f_{des} \times \left( \frac{f_{des}}{\Delta f} - 1 \right) \quad (5)$$

It is readily seen from equation (5) that $f_{mc}$ is approximately proportional to the square of $f_{des}$, and approximately inversely proportional to $\Delta f$. Therefore, in a system which has, for example, an octave frequency range, and in which it is desired that $\Delta f$ remain constant, either (1) the high frequency clock must be variable in a precision manner, or (2) additional divider stages and an even higher frequency clock are necessary. In some applications, neither of the above is a desirable method because of cost, parts-count and reliability considerations. Also, as the number of counter stages increases, higher speed counting devices must be used, normally meaning devices which dissipate more power.

Combining Equations (1) and (5) yields:

$$N = \frac{f_{des}}{\Delta f} - 1 \quad (6)$$

It is therefore apparent that the divide ratio, N, is proportional to the desired frequency and inversely proportional to the frequency resolution. If a frequency synthesizer is used, for example, in a conventional 1200 b.p.s. modem, the desired frequencies will be 1200 Hz and 2400 Hz and the desired frequency resolution may be approximately 3.25 Hz. Equation (6) therefore shows that N equals 368.23 if the desired frequency is 1200 Hz, and N equals 737.46 if the desired frequency is 2400 Hz. Rounding N to 368 and 737, respectively, rearranging Equation (1) to solve for $f_{mc}$, and inserting the above values of $f_{des}$ and N, reveals the following results:

TABLE I

| | Frequency and Divide Ratio Relationships | | |
|---|---|---|---|
| $f_{des}$ | $\Delta f$ | $f_{mc}$ | N |
| 1200 | 3.25 | 0.4416 MHz | 368 |
| 2400 | 3.25 | 1.7688 MHz | 737 |

A typical system will use only one master clock frequency and $f_{mc}$ must be a sufficiently high frequency to obtain the desired frequency resolution at the highest desired frequency. Table I indicates that $f_{mc}$ equals 1.7688 MHz. Equation (1) therefore requires N to equal 1474 to obtain the lower desired frequency of 1200 Hz. An N of 1474 will require eleven counter stages to divide $f_{mc}$ down to $f_{des}$. At $f_{mc}$ equals 1.7688 MHz and $f_{des}$ equals 1200 Hz, changing N by 1 (change in least significant control bit) will, from Equation (4), produce a frequency change of 3.25 Hz. However, at $f_{des}$ equals 1200 Hz, a change in the least significant bit will now produce a frequency change of 0.81 Hz. To obtain the same desired frequency change at 1200 Hz, N must change not by 1, but by 4 for each step. This requires that the control information be introduced at a higher stage (third least significant bit) to obtain a constant frequency resolution.

Therefore, in the given example, where it is desired to employ a frequency synthesizer with an approximately constant frequency resolution over an octave range of desired frequency while using a single master clock frequency, it will be necessary to use an eleven stage counter and be able to shift the point where the divide control information must be applied from the least significant bit stage to the third least significant bit stage. To be able to shift this point from one stage to another requires either additional logic circuitry or two additional control lines. Additional logic circuitry has the undesirable effects of requiring additional power, generating additional heat, decreasing system reliability, and requiring additional space. Additional control lines have the undesirable effects of requiring more space and requiring a controller to perform additional instructions, thereby decreasing its overall performance and speed.

Furthermore, the output obtained by using a conventional divide-by-N circuit is extremely asymmetrical and is therefore unusable in a phase locked loop. One method that may be used to obtain a symmetrical output is to double the master clock frequency and add an additional divide-by-2 stage at the end of the counter. In this typical example, $f_{mc}$ would then be 3.5376 MHz and twelve counter stages would be required. It is well known that the power consumed and the heat generated by logic circuitry increases approximately proportionatey to the square of the clock frequency, so doubling the clock frequency has roughly quadrupled the power required and heat generated. Furthermore, the ability to use a lower speed clock allows somewhat slower, low power CMOS devices to be used. Also, slower logic families tend to be less expensive. It is advantageous to keep the clock frequency as low as possible.

SUMMARY OF THE INVENTION

The present invention provides a frequency synthesizer having a substantially constant resolution over a wide frequency range. The invention employs frequency-averaging circuitry reducing the master clock frequency, while obtaining constant frequency resolution. This results in significantly reduced power requirements, significantly reduced heat generation, and increased system reliability.

Generally characterized, the present invention is an improved digital frequency synthesizer which obtains a substantially constant resolution over a relatively wide range of possible output frequencies. This represents an improvement over the prior art in that the possible resolution of the output frequency may be maintained at a substantially constant value when higher frequency outputs are employed. By achieving this, the present invention provides a frequency synthesizer which, for a given predetermined master clock frequency and a given range of output frequencies, can achieve a specified resolution over a range of output frequencies employing a considerably smaller number of stages in the divider chain that would have been required in the prior art.

In the preferred form of the present invention, additional counting stages are used in the control circuitry to achieve this result. However, the prior art approach to providing a specified resolution over a given range of output frequencies requires altering the frequency of the master clock signal or increasing the number of stages in the main divider chain. This approach, of necessity, requires relatively high-speed counting devices to be used, particularly at the upper end of the divider chain. As is known to those skilled in the art, such high-speed devices tend to be more costly, and also tend to dissipate more power. One of the motivations which led to the development of the present invention was to provide a digital frequency synthesizer having a constant resolution over a specified range of frequencies which could be implemented with a relatively low-speed master clock signal and relatively slow CMOS devices.

As is known to those skilled in the art, conventional frequency synthesizers include a divider chain composed of a series of counters. These counters are repetitively loaded to a preset count upon each occurrence of the entire counting chain counting to a particular terminal count condition, normally overflow or underflow. A plurality of lines normally provide a frequency control code to the parallel inputs of the counters, which determine the initial count to which counter stages are loaded each time the terminal count is reached. Variation of the frequency control code varies the initial count and thus varies the ultimate output frequency of the synthesizer.

Broadly characterized, the present invention employs a conventional divider chain which may be conveniently segmented into a high-speed counter section and a low-speed counter section. Interposed between the normal frequency control code lines and the parallel inputs of the counter chain is frequency control circuitry including an adjusting counter and a multiplexing device, referred to herein as a count selector. In the preferred form of the present invention, the adjusting counter is loaded with a signal representing the frequency control code upon each occurrence of a predetermined number of cycles in the output signal. The adjusting counter is clocked from an output of a particular one of the high-speed counter stages.

The count selector device selects among several possible preset numbers for the high-speed counter stages. The particular preset number selected by the count selector is determined by the state of an overflow output from the adjusting counter. In other words, when the adjusting counter is initially loaded, its overflow output is not active, and thus a particular one of the preset numbers is repetitively loaded into the high-speed counter stages of the synthesizer. Since the adjusting counter is clocked off a particular stage in the divider chain, the high-speed counter will count through a predetermined number of cycles before the adjusting counter overflows and causes the count selector to provide a different preset number to the parallel inputs of the high-speed stages.

In the preferred embodiment, the last stage of what is defined as the high-speed counting stages provides the output signal which clocks the adjusting counter. Thus, the high-speed counter stages will be loaded M times with a first preset value where M represents the difference between the overflow count condition of the adjusting counter and the number to which the adjusting counter is preset.

Once the adjusting counter has overflowed, the count select apparatus will continue to provide the second preset number to the high-speed stages until the predetermined number of cycles in the frequency synthesizer output have occurred, causing the adjusting counter to be loaded to its particular preset value.

If one takes the number of cycles in the synthesizer output signal between the consecutive loadings of the adjusting counter as a predetermined period of time (which may vary in value) it will be appreciated that the adjusting counter may be thought of as a device which causes the high-speed counter stages to provide a signal corresponding to one output frequency for a particular fraction of that period of time, and to provide a count corresponding to another output frequency for the balance of that particular fraction of time.

Taking the example of a single cycle of the synthesizer output frequency, the adjusting counter may be thought of as varying the duty cycle at which the high-speed counter counts with a first modulus corresponding to one output frequency and a second modulus corresponding to another. The cumulative effect is to provide an ultimate output signal from the frequency synthesizer which lies between the frequency which would be generated by the synthesizer if the high-speed stages were always preset to the first preset value or always preset to the second preset value.

When more than one cycle of the synthesizer output frequency is required between loadings of the adjusting counter, it will be appreciated that the trade-off to obtain the substantially constant resolution is a slight jitter in the output frequency. However, in embodiments of the invention which the adjusting counter is loaded at a rate equal to or faster than the output frequency being provided by the synthesizer, such jitter will not necessarily occur.

In the preferred form of the present invention, the dividing line between the high-speed counter stages and the low-speed counter stages is taken to be the stage from which the adjusting counter is clocked. Adopting this convention, it will be appreciated that the present invention may also be considered one for which the adjusting counter causes the high-speed counter to count at a particular modulus for a first number of complete counting cycles of the high-speed counter. Following this (when the adjusting counter reaches overflow) the high-speed counter counts at a second predetermined modulus for a second number of complete counting cycles. The first and second numbers of complete counting cycles of the high-speed counter referred to above equals a constant which is determined by the number of stages of the adjusting counter and the number of stages between the output of the high-speed counter (which clocks the adjusting counter), and the particular stage from the lower speed counter which loads the adjusting counter. Naturally, the relative values of the first and second numbers referred to immediately above is determined by the frequency control code which defines the preset count of the adjusting counter each time it is loaded.

Thus, it is an object of the present invention to provide a method and an apparatus for synthesizing a desired frequency, over a range of frequencies, with approximately the same desired frequency resolution over the entire range of frequencies.

According to another object of the present invention, a desired frequency is synthesized by generating a signal of a first frequency, $f_1$, for a predetermined time, $T_1$, and a second frequency, $f_2$, for a second predetermined time, $T_2$, such that the average frequency, $$f_{av} = \frac{f_1 T_1 + f_2 T_2}{T_1 + T_2}, \quad (7)$$

over the period $T_1 + T_2$ is the desired frequency.

According to another object of the present invention, a desired frequency resolution is achieved by varying the amount of a first time ($T_1$) that a predetermined frequency $f_1$ is synthesized, and the amount of a second remaining time ($T_2$) that a predetermined frequency $f_2$ is synthesized.

It is a further object of the present invention to achieve a constant frequency resolution, $\Delta f$, over a wide range of synthesized frequencies, with a fixed master clock frequency, by alternating the divide ratio, N, between two predetermined values at a predetermined rate.

It is still to another object of the present invention to provide a frequency synthesizer for which the system power requirements and heat dissipation requirements are reduced by using a lower master clock frequency.

According to another aspect of the present invention, system reliability is increased by reducing the parts count, the heat generated and the number of high frequency counter stages.

It will be appreciated from the following detailed description of the preferred embodiment that the present invention achieves these objects and overcomes the above-cited drawbacks of the prior art.

DETAILED DESCRIPTION

Figure 1:
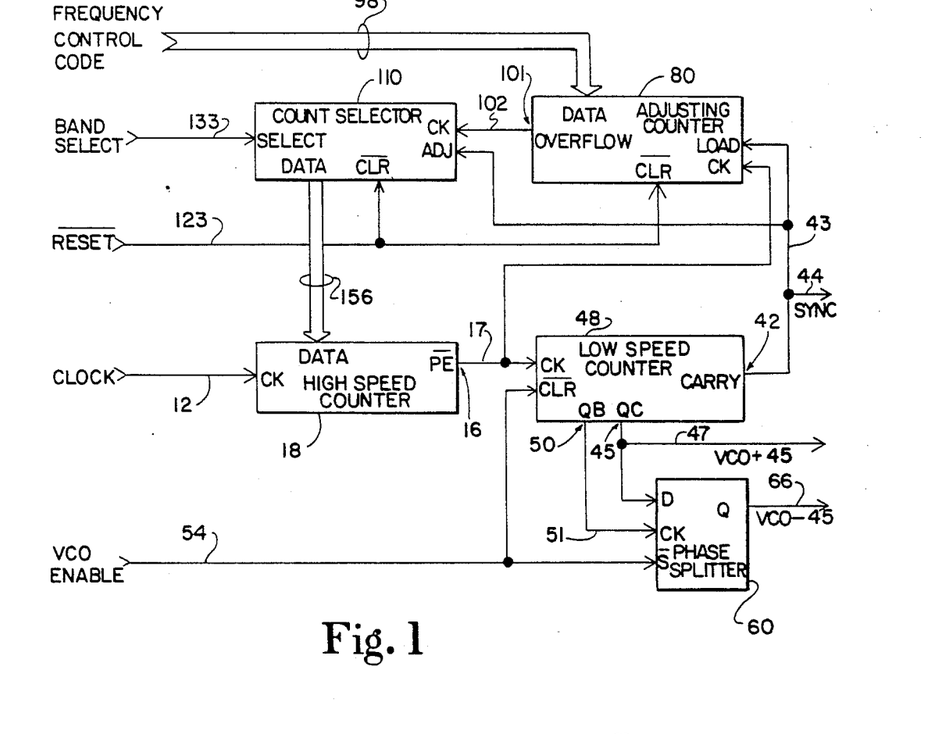
FIG. 1 is a block diagram of the preferred embodiment of the present invention.

Turning now to the drawings in which like numerals reference like components, the preferred embodiment of the present invention will now be described. FIG. 1 is a block diagram of the preferred embodiment of the present invention. A clock signal is provided to the clock input of high speed counter 18 via conductor 12. Counter 18 performs an asymmetrical divide-by-N function, and therefore, after every N cycles of the clock signal, counter 18 sends an inverted pulse, $\overline{PE}$ 16, to the clock inputs of low speed counter 48 and adjusting counter 80 via conductor 17. The significance of N is described in more detail below.

Counter 48 is a four-stage counter and has three outputs: $Q_C$, $Q_B$, and CARRY shown as 50, 45 and 42, and representing a divide-by-4, a divide-by-8, and an asymmetrical divide-by-16 function, respectively. Outputs $Q_B$ and $Q_C$ are discussed below. CARRY output 42 provides a pulse which occurs on every sixteenth positive-going transition of the $\overline{PE}$ signal on line 17. This CARRY pulse 42 provides a SYNC output, which is discussed below, on line 44 and also controls the LOAD input of adjusting counter 80 and the ADJUST input of counter selector 110 via conductor 43. It is therefore seen that cascaded counters 18 and 48 perform an asymmetric divide-by-16N function with respect to the clock signal on line 12.

A frequency control code is provided to the data inputs of counter 80 via bus 98. Counter 80 loads the data present on bus 98 in response to each CARRY pulse on line 43, and then counter 80 increments, by one, its contents on the positive-going transition of the $\overline{PE}$ 16 pulse. Whenever the contents of counter 80 have a value of $15_{10}$, overflow output 101 becomes a logic 1. Overflow output 101 is provided to the clock input of count selector 110 via conductor 102.

The data output of count selector 110 is connected to the data input of counter 18 via bus 156 and represents the value N used by counter 18. A band select input signal is provided to the select input of count selector 110 via conductor 133 and causes count selector 110 to provide an initial code on its data output. Overflow output 101 causes this code to be changed, and a CARRY signal on line 43 causes this code to revert to its initial code. Counters 18 and 48 therefore count down the clock frequency on line 12 to approximately the desired frequency and counter 80 and count selector 110 comprise a feedback path such that the average output frequency is the desired frequency.

Output 45 of counter 48 changes states on the positive-going transition of every eighth $\overline{PE}$ pulse on line 17. $Q_C$ 45 is connected to an output labeled VCO+45 which appears on line 47, and to the D input of phase splitter 60 via conductor 47. $Q_B$ output 50 changes states on the positive-going transition of every fourth $\overline{PE}$ pulse on line 17. $Q_B$ is connected to the clock input of phase splitter 60 via conductor 51. Phase splitter 60 is a conventional 90 degree phase splitter. Phase splitter 60 has one output which is designated VCO−45 on conductor 66. VCO−45 lags VCO+45 (line 47) by ninety degrees.

A VCO ENABLE input signal is connected via conductor 54 to the negated clear input of counter 48 and the negated set input of phase splitter 60. This input is provided by an external device, described hereinbelow, used with the preferred embodiment. When VCO ENABLE is a logic "0", counter 48 and phase splitter 60 are cleared and disabled.

A $\overline{RESET}$ input from the same external device is connected via conductor 123 to the negated clear inputs of adjusting counter 80 and count selector 110. When $\overline{RESET}$ is low, adjusting counter 80 is cleared and disabled, and count selector 110 is set to the initial value specified by the band select signal on line 133 and disabled.

The operation of the present invention may therefore be briefly described as follows. The VCO ENABLE input is used to initialize counter 48 and phase splitter 60, and the $\overline{RESET}$ input is used to initialize count selector 110 and adjusting counter 80. The band select input causes count selector 110 to provide a first predetermined value, $N_1$, to counter 18. In response to clock signals on line 12, counter 18 repeatedly counts down from $N_1$ to 0, sends out a $\overline{PE}$ pulse at a first predetermined frequency, $f_1$, i.e., every $N_1$ pulses on line 12, and reloads itself with the value $N_1$. Counters 48 and 80 increment their respective contents by one on each $\overline{PE}$ pulse. When counter 80 overflows, it causes count selector 110 to send a second predetermined value, $N_2$, to counter 18. This new value, $N_2$, causes counter 18 to send out $\overline{PE}$ pulses at a second lower predetermined frequency, $f_2$. Since the frequency of the $\overline{PE}$ pulses is reduced, the rate at which counters 48 and 80 increment their contents is reduced.

When counter 48 overflows, it causes counter 80 to be loaded again with the value represented by the frequency control code, and causes count selector 110 to again output the first predetermined value, $N_1$. Counter 18 is then again loaded with the first value, $N_1$, and again sends out the $\overline{PE}$ pulses at the first frequency, $f_1$. Counter 18 therefore alternately sends out $\overline{PE}$ pulses at the rate of $f_1$ and at the rate of $f_2$. Since the CARRY output of counter 48 is the divide-by-16 output and the $Q_c$ output is the divide-by-8 output, it is seen that counter 80 will be loaded with the value represented by the frequency control code at the end of every other cycle of VCO+45.

The $Q_c$ output of counter 48, which is a divide-by-8 function of the $\overline{PE}$ pulses, therefore alternately provides a signal of $f_1/8$ and $f_2/8$. Since the $Q_c$ output is the VCO+45 signal, the output of the present invention, VCO+45, alternately has a frequency of $f_1/8$ and $f_2/8$, where $f_1/8$ is higher than the desired frequency, and $f_2/8$ is lower than the desired frequency. The frequency control code determines the point at which counter 80 overflows, therefore determining the point at which the frequency of the $\overline{PE}$ pulses will change from $f_1$ to $f_2$ and, consequently, the point at which the frequency of outputs VCO+45 and VCO−45 will shift from $f_1/8$ to $f_2/8$. The frequency control code is selected so that the average frequency of outputs VCO+45 and VCO−45 is, as determined by Equation 7, the desired output frequency.

Figure 2:
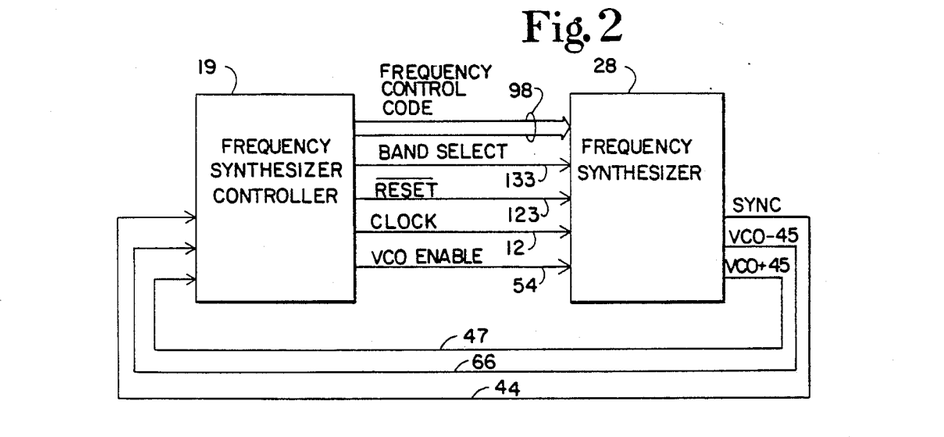
FIG. 2 is an interconnect diagram between the present invention and a frequency synthesizer controller used with the present invention.

Turn now to FIG. 2, which is an interconnect diagram between the frequency synthesizer 28 and the frequency synthesizer controller 19. Frequency synthesizer controller 19 is the external device referred to above. Controller 19 provides the frequency control code, band select signal, clock signal, VCO ENABLE, and $\overline{RESET}$ to synthesizer 28. It will be appreciated by the skilled in the art that frequency synthesizer controller 19 may be composed of discrete components, microprocessors, or a combination of analog and digital components. It will also be appreciated by one skilled in the art that frequency synthesizer controller 19 may be simple or complex, depending on whether the overall function desired is simple, e.g., a signal generator, or complex, e.g., a phase-locked loop. The nature of any particular embodiment of controller 19 is determined by the environment in which the present invention is used for a particular application.

The SYNC, VCO+45, and VCO−45 signals are output from the frequency synthesizer 28 to frequency synthesizer controller 19 and/or other circuits, depending on the overall function desired. The clock signal on line 12, the frequency control code (bus 98), the band select signal, the VCO ENABLE signal, and the $\overline{RESET}$ signal are external inputs to the preferred embodiment of the present invention, and the VCO+45, VCO−45, and SYNC signals are outputs. As will be discussed in detail below, the band select signal on line 133 controls the approximate frequency and the frequency control code (bus 98) controls the precise frequency of the VCO−45 and VCO+45 outputs.

Figure 3:
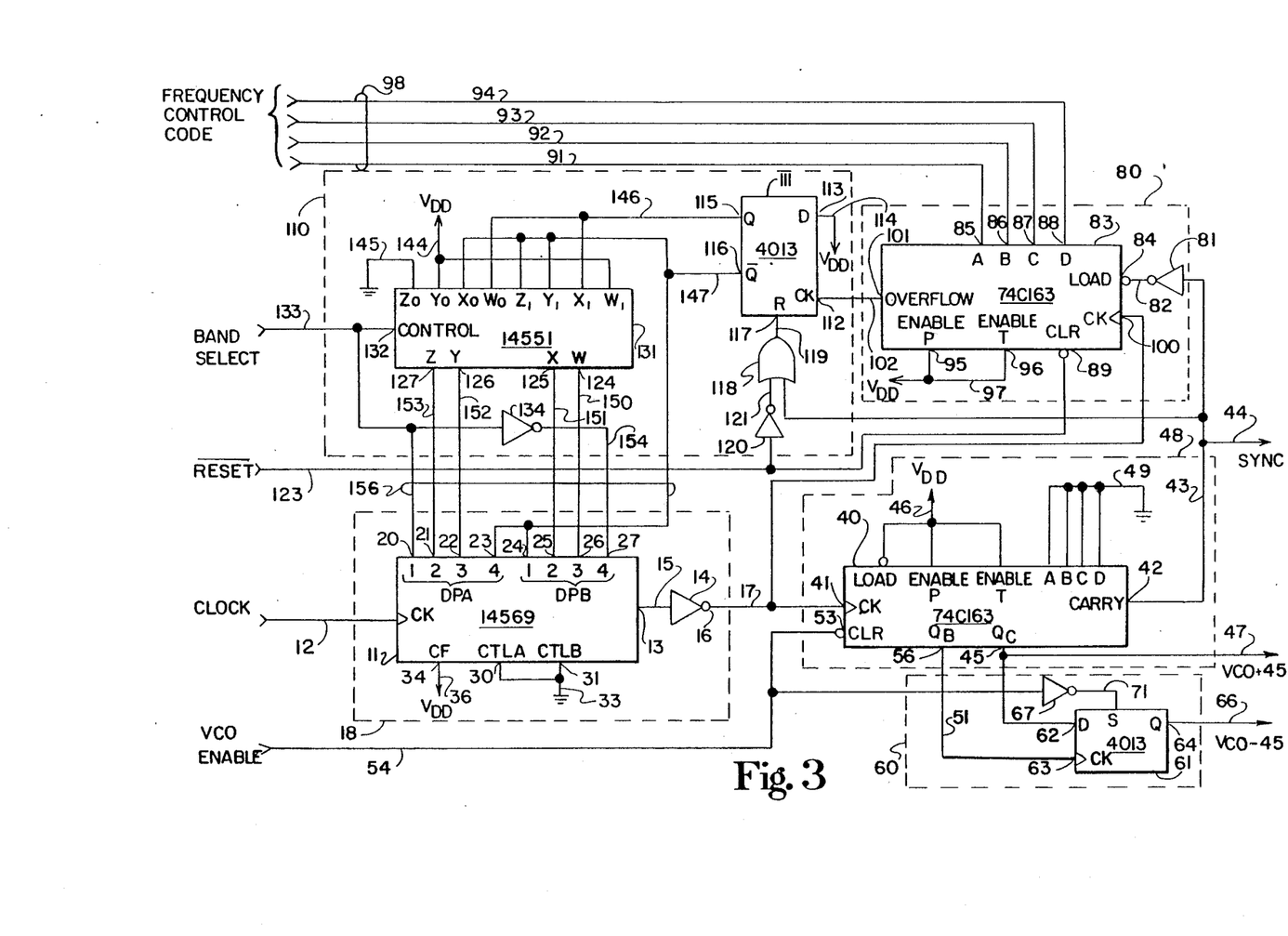
FIG. 3 is a schematic diagram of the preferred embodiment of the present invention.
Figure 4:
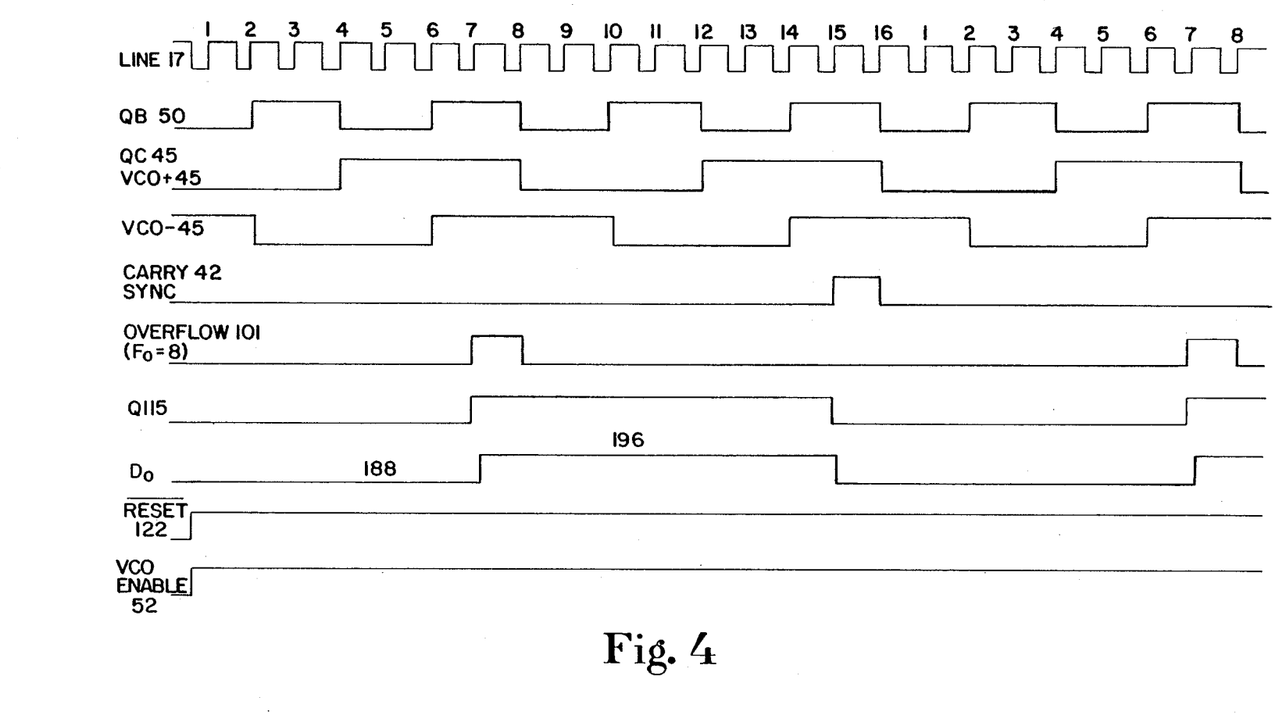
FIG. 4 is a timing diagram illustrating the operation of the preferred embodiment of the present invention.

FIG. 3 is a schematic diagram of the preferred embodiment of the present invention, and FIG. 4 is a timing diagram showing various signals used in the preferred embodiment. The timing relationships depicted in FIG. 4 are based upon the band select signal being a logical 0, and the frequency control code having a value of $8_{10}$.

Turning now to FIG. 3, a 1.8432 MHz clock signal is provided to the clock input of high speed counter 11 on conductor 12. High speed counter 11 is a decrementing counter which decreases its stored value by one on each positive-going transition of the clock signal. If high speed counter 11 initially had a stored value of $D_0$ then, after the first positive-going transition of the clock signal, counter 11 will have a stored value of $D_0-1$. On the $(D_0-1)^{th}$ positive-going transition of the clock signal on line 12 the stored value, D, of high speed counter 11 is decremented to one and PE output 13 of counter 11 begins to transition from a low state to a high state. On the $D_0^{th}$ positive-going transition of the clock signal, the stored value, D, of high speed counter 11 is decremented to zero, the PE output 13 of counter 11 makes a transition from a 1 to a 0, and counter 11 is again preset to the value of $D_0$.

$D_0$ is the value of the binary number present on preset inputs 20 through 27, inclusive, of high speed counter 11. Preset inputs 20 through 27 are binary value inputs, where preset input 27 represents the most significant bit and preset input 20 represents the least significant bit. Thus when preset inputs 27 through 20 have binary values of 0 1 0 1 1 1 1 1, respectively, placed upon them, the value of $D_0$ is $95_{10}$. High speed counter 11 will therefore preset to a count of 95 and decrement to zero after 95 clock pulses on line 12. The method by which binary word $D_0$ is generated and presented to preset inputs 20 through 27 is discussed later in this section.

High speed counter 11 is embodied in a type 14569 CMOS counter, currently manufactured by RCA and others.

Inputs CTLA 30 and CTLB 31 of counter 11 are connected to circuit ground through conductor 33 and, since circuit ground represents a logical 0, the type 14569 counter is programmed to function as a binary counter. Input 34 CF of high speed counter 11 is connected to the positive power supply (logic 1) by conductor 36. This causes counter 11 to preset each time it has counted down to zero. PE output 13 of high speed counter 11 is inverted by inverter 14, the output of which is connected to clock input 41 of low speed counter 40 by line 17.

The frequency of output $\overline{PE}$ 16 is the frequency of the clock signal on line 12 divided by $D_0$. If $D_0$ is 95, then $\overline{PE}$ 16 will have a frequency of 1.8432 MHz/95 which equals 19,402 Hz.

Low speed counter 40 increments its stored value, E, by one on each positive going transition of output $\overline{PE}$ 16. Since the negated load input and the enable inputs of counter 40 are connected to a logic 1 by conductor 46, and since the data inputs A, B, C, and D of counter 40 are connected to a logic 0 by conductor 49, low speed counter 40 is a four bit counter and therefore E may have any value from zero to fifteen. Carry output 42 of counter 40 is a 0 for E values of zero to fourteen, and is a 1 for an E value of fifteen. Therefore, if E is initially zero then, as shown in FIG. 4, after the fifteenth positive going transition of output $\overline{PE}$ 16, E will have a value of fifteen and carry output 42 will be a 1. On the sixteenth positive going transition of output $\overline{PE}$ 16, E will again have a value of zero, and carry output 42 will again be a 0. It is therefore seen from FIG. 4 that carry output 42 is a non-symmetrical divide-by-16 function of the signal PE from output 13 of counter 11. Carry output 42 is connected to the LOAD input of adjusting counter 80 and to count selector 110 via conductor 43. Carry output 42 also provides the SYNC output signal on conductor 44.

The SYNC output is used externally to advise the frequency synthesizer controller 19 that adjusting counter 80 is ready to receive a new frequency control code from bus 98.

The divide-by-8 output, 45 $Q_c$, of low speed counter 40 provides the VCO+45 output on conductor 47. The VCO+45 output is therefore the signal on line 17 divided by 8. Therefore the frequency of the VCO+45 output signal is the clock frequency (line 12) divided by the product of eight times $D_0$:

$$f_{VCO+45} = \frac{f_{mc}}{8D_0} \qquad (8)$$

For $D_0$ equals 95, output VCO+45 is:

1.8432 MHz÷(8×95)=2425 Hz.

Output 45 $Q_c$ is also connected to data input 62 of a D-type flip-flop 61 of phase splitter 60 by conductor 47. The divide-by-4 output, 50 $Q_B$, of low speed counter 40 is connected to the clock input 64 of flip-flop 61 by conductor 51. From FIG. 4 it is seen that connecting outputs 50 and 45 to flip-flop 61 in the manner described will cause the Q output 64 of flip-flop 61 to lag output $Q_c$ 45 by ninety degrees. The Q Output 64 provides the external VCO−45 output on conductor 66.

Outputs VCO+45 and VCO−45, the quadrature components of the desired frequency, are provided to frequency synthesizer controller 19 as discussed above.

The external VCO ENABLE signal is connected to the negated clear input 53 of low speed counter 40 and to the input of inverter 67 of phase splitter 60 by conductor 54. The output of inverter 67 is connected to the set input of flip-flop 61 by conductor 71. Therefore, when the VCO ENABLE signal is a 0, low speed counter 40 is cleared and outputs 50, 45, and VCO+45 become a 0. The output of inverter 67 becomes a 1, and the output of flip-flop 61 (VCO−45) becomes a 1. When the VCO ENABLE signal on line is a logic 1, low speed counter 40 and flip-flop 61 operate as previously described.

Carry output 42 of low speed counter 40 is connected to the input of inverter 81 of adjusting counter 80 via conductor 43. The output of inverter 81 is connected to LOAD input 84 of counter 83 via conductor 82. When, as previously described, carry output 42 becomes a 1, LOAD input 84 becomes a 0 and counter 83 stores the value represented by the signals present on its parallel inputs 85–88. Inputs 85–88 are connected to external frequency control code input via bus 98, which consists of conductors 91–94. Conductor 94 carries the most significant bit of the frequency control code. The frequency control code is a 4-bit code, having a range of values from zero to fifteen. The enable inputs 95 and 96 of counter 83 are connected to a 1 by conductor 97 so as to permit counter 83 to load and count.

The output from counter 18 on line 17 is also connected to clock input 100 of counter 83 by conductor 17. Counter 83 therefore increments its stored value, F, by one each time counter 11 counts down to zero. From FIG. 4 it is seen that, since counter 83 may be loaded with a stored value, $F_0$, between zero and fifteen, the overflow output (ripple carry output) 101 of counter 83 will make a transition from 0 to a 1 on the Kth positive going transition of the signal on line 17 when $F_0+K$ equals fifteen, and overflow output 101 will make a transition from 1 to 0 on the next $(K+1)^{th}$ positive going transition of the signal. The overflow output 101 is connected to clock input 112 of a D-type flip-flop 111 of count selector 110 via conductor 102. The data input 113 of flip-flop 111 is connected to a logic 1 by line 114. From FIGS. 3 and 4 it is seen that flip-flop 111 is used as a latch and, upon a positive going transition of overflow output 101, Q output 115 will become a 1 and $\overline{Q}$ output 116 will become a 0 and outputs 115 and 116 will remain in this state until flip-flop 111 is reset by a 1 appearing at the reset input 117 of flip-flop 111.

The reset input 117 is connected to the output of OR-gate 118 via conductor 119. One input of OR-gate 118 is connected to carry output 42 of low speed counter 40 by line 43. The other input of OR-gate 118 is connected to output of inverter 120 via conductor 121. The input of inverter 120 and the negated clear input 89 of counter 83 are connected to the external $\overline{RESET}$ input on line 123. As shown in FIG. 4, a 0 on the $\overline{RESET}$ input will therefore set the Q output 115 and Q output 116 to 0 and 1, respectively, and will set the value of the contents of counter 83 to zero. The $\overline{RESET}$ input is a control signal from frequency synthesizer controller 19 and is used to initialize count selector 110 and adjusting counter 80.

The external band select input is connected to control input 132 of multiplexer 131 and to the input of inverter 134 via conductor 133. Those skilled in the art will realize that the Z, Y, X and W outputs of multiplexer 131 will be internally connected to inputs $Z_0$, $Y_0$, $X_0$ and $W_0$ respectively, of multiplexer 131 if the band select signal is a 0 and internally connected to inputs $Z_1$, $Y_1$, $X_1$ and $X_1$, respectively, if the band select signal is a 1.

From inspection of FIG. 3, it will be appreciated that the W through Z outputs of multiplexer 131 are connected to inputs DPB3, DPB2, DPA3 and DPA2 of high speed counter 11, respectively. The various inputs to the multiplexers are connected either to a logical 0 condition at ground, logical 1 condition of the positive power supply, or to one of the outputs of flip-flop 111. Additionally, inputs 23 and 24 of counter 11 (DPA4 and DPB1, respectively) are connected to the negated output 116 of flip-flop 111. Lastly, the band select signal on line 133 is provided in asserted form to input 20 (DPA1) and, by inverter 134, in negated form to input 27 (DPB4) of counter 11.

Without belaboring the point as to each individual connection, inspection of FIG. 4 will indicate to one skilled in the art that the parallel inputs of high speed counter 11 are in the states depicted in the following Table II, depending upon the condition of the band select signal present on line 131. In Table II, the notation 115 indicates that the particular parallel input is connected to the Q output 115 of flip-flop 111, and the notation 116 indicates that the parallel input is connected to the negated output of this flip-flop. In Table II, the parallel inputs of counter 11 which are connected to outputs of multiplexer 131 are so indicated by the letter in parentheses over the name of the respective parallel input.

TABLE II

| Band Select (line 133) | DPA1 | (Z) DPA2 | (Y) DPA3 | DPA4 | DPB1 | (X) DPB2 | (W) DPB3 | DPB4 |
|---|---|---|---|---|---|---|---|---|
| 0 | 0 | 0 | 0 | 1 | 116 | 116 | 116 | 115 | 1 |
| 1 | 1 | 116 | 116 | 116 | 116 | 115 | 1 | 0 |

It should be noted that Table II is arranged with the least significant bit of the parallel input at the left-hand side of the Table, proceeding to the most significant bit at the right-hand side. From inspection of Table II and FIG. 3, it will be apparent that the initial value $D_0$ loaded into counter 11, upon each parallel loading, is a function of both the band select signal on line 133 and the output state of flip-flop 111.

The initial value, $D_0$, loaded into high speed counter 11, will be, in standard binary notation, and with the most significant bit on the left:
1Q$\overline{Q}\overline{Q}\overline{Q}$100 when band select 130 is a 0, and
01Q$\overline{Q}\overline{Q}\overline{Q}$1 when band select 130 is a 1.

The initial preset value, $D_0$, of high speed counter 11 will therefore be as shown in the following Table III:

TABLE III

| Band Select (line 133) | Q Output Of Flip-Flop 111 | $D_0$ (binary) | $D_0$ |
|---|---|---|---|
| 0 | 0 | 10111100 | 188 |
| 0 | 1 | 11000100 | 196 |
| 1 | 0 | 01011111 | 95 |
| 1 | 1 | 01100001 | 97 |

As shown by Equation (8) above, output VCO+45 on line 47 has a frequency equal to the frequency of the clock signal on line 12 divided by the product of 8 times $D_0$. VCO+45 will therefore have one of the following frequencies: 1225 Hz, 1175 Hz, 2425 Hz or 2375 Hz if the particular preset value $D_0$ and the output of flip-flop 111 remains at one of the values shown in Table III. The desired frequency, $f_{des}$, is defined as the time-weighted average frequency, over two cycles of VCO+45, and is obtained by rapidly alternating the frequency of VCO+45 between two frequencies.

The rapid alternation between two frequencies is obtained by using adjusting counter 80, count selector 110, and the frequency control code input to determine the point in time at which VCO+45 is changed from 1225 Hz to 1175 Hz when the band select is a 0, or from 2425 Hz to 2375 Hz when the band selector signal is a 1.

As described above, counter 83 causes the Q output 115 of flip-flop 111 to become a 1 whenever $F_0+K=15$, where K is the number of transitions of $\overline{PE}$ output 16 and $F_0$ is the preset count of counter 83. Thus K is equivalent to the number of complete count cycles of high speed counter 11. If the band select signal is a 0, and Q output 115 is initially a 0, the $D_0$ value input to high speed counter 11 will be 10111100 ($188_{10}$), then when $F_0+K=15$, Q 115 will become a logic 1 and the new $D_0$ value input to high speed counter 11 will be 11000100 ($196_{10}$). The frequency of the VCO+45 output signal will therefore shift from 1225 Hz to 1175 Hz when $F_0+K=15$. Carry output 42 of low speed counter 40 will become a 1 when K=15, and causes flip-flop 111 to be reset, which causes $D_0$ to again become $188_{10}$, and also causes counter 83 to be loaded with a new value, $F_0$, determined by the frequency control code. The fact that adjusting counter 80 loads on K=15 follows from the fact that low speed counter 40 has a scale of 15 and adjusting counter 80 loads on the overflow of counter 40.

From FIG. 4 it is seen that if, for example, $F_0$ is 1000 ($8_{10}$), the VCO+45 signal would have an initial frequency of 1225 Hz. On the seventh positive going transition of line 17, overflow output 101 becomes a 1, Q output 115 of flip-flop 111 becomes a 1. On the eighth positive going transition of $\overline{PE}$ 16, $D_0$ is changed to $196_{10}$, and the frequency of the VCO+45 signal becomes 1175 Hz. On the fifteenth positive going transition of $\overline{PE}$ 16, carry output 42 becomes a 1, counter 83 is loaded with a new value of $F_0$, and flip-flop 111 is reset. On the sixteenth positive going transition on line 17, $D_0$ reverts to $188_{10}$, and the frequency of VCO+45 will again be 1225 Hz. Since the frequency of carry output 42 is the frequency of $\overline{PE}$ output 16 divided by 16, and the frequency of VCO+45 is the frequency of this output divided by 8, the frequency of VCO+45 is twice the frequency of carry output 42. Therefore, carry output 42 will cause $D_0$ to revert to $188_{10}$ after every two cycles of the VCO+45 output signal.

By combining Equations (2) and (7) above it is therefore seen that the average frequency of the VCO+45, over two cycles, is $$\bar{f}_{VCO+45} = \frac{f_{mc}}{(1504 + 4F_0)} \quad (9)$$

and for $F_0=8$ and $f_{mc}=1.8432$ MHz, $$\bar{f}_{VCO+45} = 1200 \text{ Hz}.$$

Varying $F_0$ from 0 to 15 thus reveals that $\bar{f}_{VCO+45}$ can be varied from 1225.5 Hz to 1178.5 Hz.

It is clearly seen that the frequency resolution, $\Delta F$, of the VCO+45 signal is:

$$\bar{f}_{VCO+45}(F_0=F_0) - \bar{f}_{VCO+45}(F_0=F_0+1) \quad (10)$$

$$\Delta f = \frac{\frac{1}{4}f_{mc}}{(376 + F_0)(377 + F_0)} \quad (11)$$

$\Delta f(F_0=0) = 3.25$ hz and $\Delta f(F_0=15) = 3.01$ Hz.

If the band select signal is a 1, then, by appropriate substitution, $D_0$ will initially be $95_{10}$, and the frequency of the VCO+45 signal will be 2425 Hz. When $D_0$ is changed to $97_{10}$, the frequency of the VCO+45 signal will be 2375 Hz. Therefore, $$\bar{f}_{VCO+45} = \frac{f_{mc}}{(760 + F_0)} \quad (12)$$

and for $F_0=8$, $\bar{f}_{VCO+45}=2400$ Hz.

Similarly, the range of the average frequency of VCO+45 is 2425 Hz to 2378 Hz. And the frequency resolution, $\Delta f$, is found to be:

$$\Delta f = \frac{f_{mc}}{(760 + F_0)(761 + F_0)} \quad (13)$$

$\Delta f(F_0=0) = 3.19$ Hz $\Delta f(F_0=15) = 3.06$ Hz.

It is therefore seen that the frequency resolution, $\Delta f$, has remained roughly constant at approximately 3 Hz even when the output frequency, the average frequency of VCO+45, has changed by an octave.

The desired output frequencies, 1200 Hz and 2400 Hz, and the frequency resolution, 3 Hz, were selected because the environment of the preferred embodiment is a 1200 b.p.s. modem. It will be apparent to one skilled in the art that other output frequencies and different frequency resolutions can be easily implemented. Furthermore a device with three or more output frequencies can be easily implemented and by using additional logic gating, the desired output frequencies can be synthesized by a time-averaged output of three or more selected frequencies. To this end, it will be appreciated that the count selector apparatus described above is configured to detect two or more count conditions of the adjusting counter, and to provide two or more respective count control signals to the high speed counter stages during each respective count condition.

The application of the present invention is not limited to modems, but can also be used, for example, in radio, television, radar, and sonar transmitters and receivers, signal generators, and other test and measurement equipment. However, it will be appreciated that the present invention is particularly useful in applications in which a digital frequency synthesizer is used as the analogue of a voltage-controlled oscillator in a digital phase-lock loop, with the analogue of the phase error signal appearing on bus 98 (FIG. 3) in the preferred embodiment. Since it should be appreciated that the frequency control code is the analogue of the phase error signal, it will be apparent to those skilled in the art that the synthesizer of the present invention may be used in a digital phase-lock loop for which the characteristic of change in frequency as a function of phase error input signal $(df/d\phi_e)$, is very nearly linear, and is constant over a relatively wide range of center frequencies.

From the foregoing description of the preferred embodiment, other embodiments of the present invention will suggest themselves to those skilled in the art. Therefore, the scope of the present invention is to be limited only by the claims hereinbelow.

I claim:

1. A frequency synthesizer for generating an output signal at a predetermined frequency comprising:
   a counter including a first predetermined number of high speed stages having count control inputs, and a second predetermined number of low speed stages;
   output means connected to at least one of said low speed stages for providing said output signal;
   input means for accepting an externally provided frequency control code; and
   adjusting means responsive to said output signal and said frequency control code for providing correction information to a count selector during each occurrence of a predetermined number of cycles of said output signal;
   said count selector being responsive to said frequency correction information to provide a first count control signal to said count control inputs for a first fraction of said predetermined number of cycles of said output signal, and a second count control signal to said count control inputs for a second fraction of said predetermined number of cycles of said output signal.

2. A frequency synthesizer as recited in claim 1 wherein:
   said adjusting means includes an adjusting counter.

3. A frequency synthesizer as recited in claim 2 wherein:
   said adjusting counter is an M stage counter, M being an integer greater than one;
   said low speed stages include K stages between the output of the most significant stage of said high speed stages and said output means, K being an integer greater than 0;
   said adjusting counter is clocked from said most significant stage of said high speed stages; and
   said predetermined number of cycles of said output is equal to $2^M/2^K$.

4. A frequency synthesizer as recited in claim 2 further comprising:
   loading means for loading said adjusting counter with binary data corresponding to said frequency control code upon each occurrence of said predetermined number of cycles of said output signal.

5. A frequency synthesizer as recited in claim 2 wherein:
said count selector comprises means for detecting a first count condition of said adjusting counter to provide said first count control signal during said first count condition, and means for detecting a second distinct count condition of said adjusting counter and providing said second count control signal during said second count condition.

6. A frequency synthesizer for generating an output signal at a predetermined frequency comprising:
a counter including a first predetermined number of high speed stages having count control inputs, and a second predetermined number of low speed stages;
output means connected to at least one of said low speed stages for providing said output signal;
input means connected to at least one of said low speed stages for periodically latching an externally provided frequency control code to provide a latched frequency control code; and
adjusting and count selector means connected to said input means and responsive to said latched frequency control code to cause said high speed stages to count through a first number of count cycles at a first division ratio, and subsequently to count through a second number of count cycles at a second division ratio, in response to each said latched frequency control code.

7. A frequency synthesizer for generating an output signal at a predetermined frequency comprising:
a counter including a first predetermined number of high speed stages having count control inputs, and a second predetermined number of low speed stages;
means connected to at least one of said low speed stages for providing said output signal;
adjusting means responsive to said output signal for providing frequency correction information to a count selector upon each occurrence of a predetermined number of cycles of said output signal;
said count selector being responsive to said frequency correction information to provide a first count control signal to said count control inputs for a first fraction of said predetermined number of cycles of said output signal, and a second count control signal to said count control inputs for a second fraction of said predetermined number of cycles of said output signal.

8. A frequency synthesizer as recited in claim 7 wherein:
said adjusting means includes a counter.

* * * * *